US011289681B2

(12) United States Patent
Wang et al.

(10) Patent No.: US 11,289,681 B2
(45) Date of Patent: Mar. 29, 2022

(54) DISPLAY PANEL HAVING A WIRE EXCHANGE AREA

(71) Applicant: KunShan Go-Visionox Opto-Electronics Co., Ltd, Jiangsu (CN)

(72) Inventors: Gang Wang, Kunshan (CN); Weilong Li, Kunshan (CN); Lu Zhang, Kunshan (CN); Zhenzhen Han, Kunshan (CN); Siming Hu, Kunshan (CN)

(73) Assignee: KunShan Go-Visionox Opto-Electronics Co., Ltd, Jiangsu (CN)

( * ) Notice: Subject to any disclaimer, the term of this patent is extended or adjusted under 35 U.S.C. 154(b) by 0 days.

(21) Appl. No.: 16/814,042

(22) Filed: Mar. 10, 2020

(65) Prior Publication Data

US 2020/0212359 A1 Jul. 2, 2020

Related U.S. Application Data

(63) Continuation of application No. PCT/CN2019/072959, filed on Jan. 24, 2019.

(30) Foreign Application Priority Data

Aug. 29, 2018 (CN) .......................... 201821406723.1

(51) Int. Cl.
*H01L 27/32* (2006.01)
*H01L 51/00* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............ H01L 51/5253; H01L 51/0097; H01L 27/3244; H01L 27/3258; H01L 2251/301; H01L 2251/5338; G02F 1/133305
See application file for complete search history.

(56) References Cited

U.S. PATENT DOCUMENTS 10,026,793 B2 * 7/2018 Jeon ..................... G09G 3/3233
10,304,913 B2 * 5/2019 Choi .................... G09G 3/3225
(Continued)

FOREIGN PATENT DOCUMENTS

| CN | 104503122 A | 4/2015 |
|----|-------------|--------|
| CN | 107342310 A | 11/2017 |

(Continued)

OTHER PUBLICATIONS

International Search Report and Written Opinion dated Mar. 29, 2019 in corresponding International application No. PCT/CN2019/072959; 10 pages including Partial English-language translation.

*Primary Examiner* — Ida M Soward
(74) *Attorney, Agent, or Firm* — Maier & Maier, PLLC

(57) ABSTRACT

The present disclosure relates to a display panel and a display device. The display panel, includes a display area, a non-display area located outside the display area, and a wire exchanging area provided between the display area and the non-display area, and the display panel including an array substrate including a flexible substrate, a first metal layer, an inorganic insulating layer, a second metal layer, and an organic flat layer provided in a laminated manner; a light-emitting element; and a packaging body configured for packaging the light-emitting element and including an inorganic layer directly contacting with the inorganic insulating layer in the wire exchanging area. The display panel of an embodiment of the present disclosure can effectively block (Continued)

water vapor and prevent water vapor from entering the display area of the display panel.

19 Claims, 3 Drawing Sheets

(51) Int. Cl.
    *H01L 51/52*     (2006.01)
    *G02F 1/133*     (2006.01)
    *G02F 1/1333*     (2006.01)

(52) U.S. Cl.
    CPC .... *G02F 1/133305* (2013.01); *H01L 27/3258* (2013.01); *H01L 2251/301* (2013.01); *H01L 2251/5338* (2013.01)

(56) References Cited

U.S. PATENT DOCUMENTS

| | | | |
|---|---|---|---|
| 10,468,628 B2 * | 11/2019 | Kim | H01L 27/3276 |
| 10,474,278 B2 * | 11/2019 | Lai | G06F 3/0445 |
| 10,482,811 B2 * | 11/2019 | Kang | H01L 27/326 |
| 10,600,854 B2 * | 3/2020 | Kim | H01L 27/3258 |
| 10,651,246 B2 * | 5/2020 | Park | H01L 27/3276 |
| 10,680,202 B2 * | 6/2020 | Shin | H01L 51/5253 |
| 10,714,689 B2 * | 7/2020 | Tanaka | H05B 33/04 |
| 10,727,424 B2 * | 7/2020 | Tanaka | H01L 27/3276 |
| 2015/0205418 A1 * | 7/2015 | Nam | G06F 3/0412 |
| | | | 345/174 |
| 2017/0075464 A1 * | 3/2017 | Ahn | G06F 3/041 |
| 2017/0092896 A1 * | 3/2017 | Nakamura | H01L 51/5256 |
| 2017/0110532 A1 * | 4/2017 | Kim | H01L 51/0096 |
| 2017/0288008 A1 * | 10/2017 | Kim | H01L 27/3206 |
| 2017/0357353 A1 * | 12/2017 | Katsuta | G06F 3/04164 |
| 2018/0032194 A1 * | 2/2018 | Koide | G11C 19/287 |
| 2018/0035540 A1 * | 2/2018 | Koide | G02F 1/136227 |
| 2018/0046221 A1 * | 2/2018 | Choi | G02B 26/0825 |
| 2018/0123062 A1 * | 5/2018 | Lee | B32B 27/281 |
| 2019/0006616 A1 * | 1/2019 | Nishimura | G02F 1/1339 |
| 2019/0361550 A1 * | 11/2019 | Sonoda | H01L 51/5275 |
| 2019/0363149 A1 * | 11/2019 | Okabe | H01L 27/3276 |
| 2019/0363267 A1 * | 11/2019 | Tanaka | G09F 9/30 |
| 2019/0363275 A1 * | 11/2019 | Ochi | H05B 33/04 |
| 2020/0006702 A1 * | 1/2020 | Sonoda | G09F 9/30 |
| 2020/0044193 A1 * | 2/2020 | Kim | H01L 51/5253 |
| 2020/0144542 A1 * | 5/2020 | Kim | H01L 51/5253 |
| 2020/0150724 A1 * | 5/2020 | Watanabe | G09F 9/301 |
| 2020/0212155 A1 * | 7/2020 | Mitani | H01L 51/0097 |
| 2020/0258964 A1 * | 8/2020 | Kim | H01L 27/3209 |
| 2021/0265429 A1 * | 8/2021 | Yamanaka | G09F 9/30 |
| 2021/0271336 A1 * | 9/2021 | Yamanaka | H05B 33/02 |

FOREIGN PATENT DOCUMENTS

| | | |
|---|---|---|
| CN | 107579078 A | 1/2018 |
| CN | 107634086 A | 1/2018 |
| CN | 207134068 U | 3/2018 |

\* cited by examiner

DISPLAY PANEL HAVING A WIRE EXCHANGE AREA

CROSS REFERENCE TO RELATED APPLICATION

This application is a continuation of International Application No. PCT/CN2019/072959, filed on Jan. 24, 2019, which claims priority from Chinese patent application No. 201821406723.1, entitled "Display Panel and Display Device", filed on Aug. 29, 2018, both of which are incorporated herein by reference in their entireties.

TECHNICAL FIELD

The present disclosure relates to the technical field of a display device, and in particular, to a display panel and a display device.

BACKGROUND

With the development of the technology of a display panel with a narrow border, it is no longer satisfied with a narrow border display effect of left and right borders in the market, and more and more attention is paid to the narrow border display of a lower border. Since the lower frame area includes a bonding area for an integrated circuit or a flexible circuit board, the narrow border effect is mainly achieved currently by a non-display area of the display panel being bent to the back of a display area. However, in order to ensure that the lower border and the upper border have the same size, the display panel needs to be bent near the display area so that the non-display area is fully bent to the back of the display area to the greatest extent.

SUMMARY

Embodiments of the present disclosure provide a display panel and a display device. The display panel can effectively block water vapor and prevent water vapor from entering the display area of the display panel.

An aspect of an embodiment of the present disclosure provides a display panel, including a display area, a non-display area located outside the display area, and a wire exchanging area provided between the display area and the non-display area, and the display panel including an array substrate including a flexible substrate, a first metal layer, an inorganic insulating layer, a second metal layer, and an organic flat layer provided in a laminated manner; a light-emitting element; and a packaging body configured for packaging the light-emitting element and including an inorganic layer directly contacting with the inorganic insulating layer in the wire exchanging area.

According to an aspect of an embodiment of the present disclosure, the first metal layer forms a first signal wire under the inorganic insulating layer, the second metal layer forms a second signal wire, the second signal wire is disconnected in the wire exchanging area to form a first segment in the display area and a second segment in the non-display area, and the first segment and the second segment are electrically connected via the first signal wire.

According to an aspect of an embodiment of the present disclosure, the inorganic insulating layer includes a first through hole and a second through hole spaced apart, a portion of the first segment extends to the first through hole and is electrically connected to the first signal wire, and a portion of the second segment extends to the second through hole and is electrically connected to the first signal wire.

According to an aspect of an embodiment of the present disclosure, the first through hole and the second through hole are both straight holes.

According to an aspect of an embodiment of the present disclosure, the array substrate includes an anode material on the inorganic insulating layer in the wire exchanging area, and the inorganic layer covers the anode material.

According to an aspect of an embodiment of the present disclosure, the non-display area can be bent to a bottom of the display area to form a shape of an arc, and the wire exchanging area extends along an axial direction of the arc.

According to an aspect of an embodiment of the present disclosure, the organic flat layer is disconnected to form a slot in the wire exchanging area so as to expose the inorganic insulating layer, and the inorganic layer extends into the slot and directly connects with the inorganic insulating layer.

According to an aspect of an embodiment of the present disclosure, the slot is provided as a through slot extending along the axial direction of the arc.

According to an aspect of an embodiment of the present disclosure, the inorganic insulating layer further includes an organic layer provided on the inorganic layer and an external inorganic layer provided on the organic layer.

The display panel of an embodiment of the present disclosure includes an array substrate, a light emitting element, and a packaging body. The display panel includes a display area, a non-display area located outside the display area, and a wire exchanging area provided between the display area and the non-display area. The packaging body includes an inorganic layer. The inorganic layer is in contact with an inorganic insulating layer included in the array substrate at the wire exchanging area to form a packaging area. As the inorganic layer and the inorganic insulating layer are both formed of an inorganic material, a contact sealing effect thereof is good, a reliability and stability of a package are improved, and water vapor is effectively prevented from entering the display area.

An aspect of an embodiment of the present disclosure provides a display device including the above display panel.

BRIEF DESCRIPTION OF THE DRAWINGS

Features, advantages, and technical effects of exemplary embodiments of the present disclosure will be described below with reference to the drawings.

DETAILED DESCRIPTION

Embodiments of the present disclosure are described further in detail below with reference to drawings and embodiments. The detailed description and drawings of the following embodiments are used to exemplarily illustrate the principle of the present disclosure, and cannot be used to limit the scope of the present disclosure, that is, the present disclosure is not limited to the described embodiments.

In the description of the present disclosure, it should be noted that, unless otherwise stated, the meaning of "a plurality" is two or more; the terms "upper", "lower", "left", "right", "inner" and "outer", etc. indicating the directions or positional relationships are only for the convenience of describing the present disclosure and simplifying the description, do not indicate or imply that the device or element referred to must have a specific orientation, structure and operation in a specific orientation, and cannot be understood as a limitation on the present disclosure. In addition, the terms "first", "second", etc. are used for descriptive purposes only, and should not be interpreted as indicating or implying relative importance.

In the description of the present disclosure, it should also be noted that the terms "installation", "connection", and "attachment" should be understood in a broad sense unless otherwise specified and limited. For example, it may be a fixed connection or a detachable connection, or an integral connection; it can be a direct connection or indirect connection through an intermediate medium. For those of ordinary skill in the art, specific meanings of the above terms in the present disclosure may be understood according to specific situations.

In order to better understand the present disclosure, a display panel 10 according to an embodiment of the present disclosure is described in detail below with reference to FIGS. 1 to 4.

Figure 1:
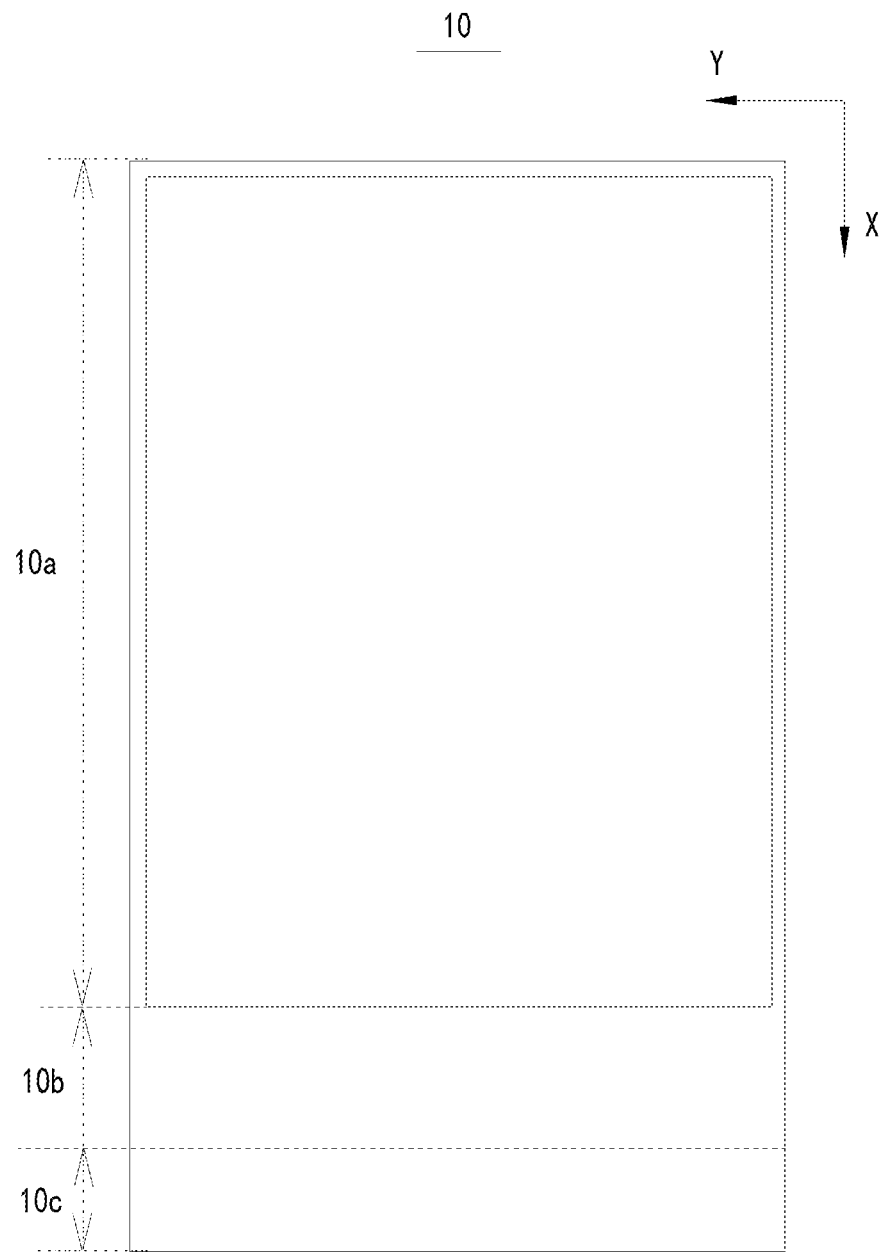
FIG. 1 is a front structural schematic view of a display panel according to an embodiment of the present disclosure.

Referring to FIG. 1, it is schematically shown that a display panel 10 according to an embodiment of the present disclosure includes a display area 10*a* and a non-display area 10*c*. The display area 10*a* of the display panel 10 has a function of light emitting imaging, and can display a specific image in a use state. The non-display area 10*c* of the display panel 10 does not have a function of light emitting imaging. In order to achieve a full screen, the non-display area 10*c* needs to be bent approximately 180 degrees and abut to the bottom of the display area 10*a*. The non-display area 10*c* is bent to form an arc structure. In order to facilitate bending of the non-display area 10*c*, a wire exchanging area 10*b* is further provided between the display area 10*a* and the non-display area 10*c*.

Figure 2:
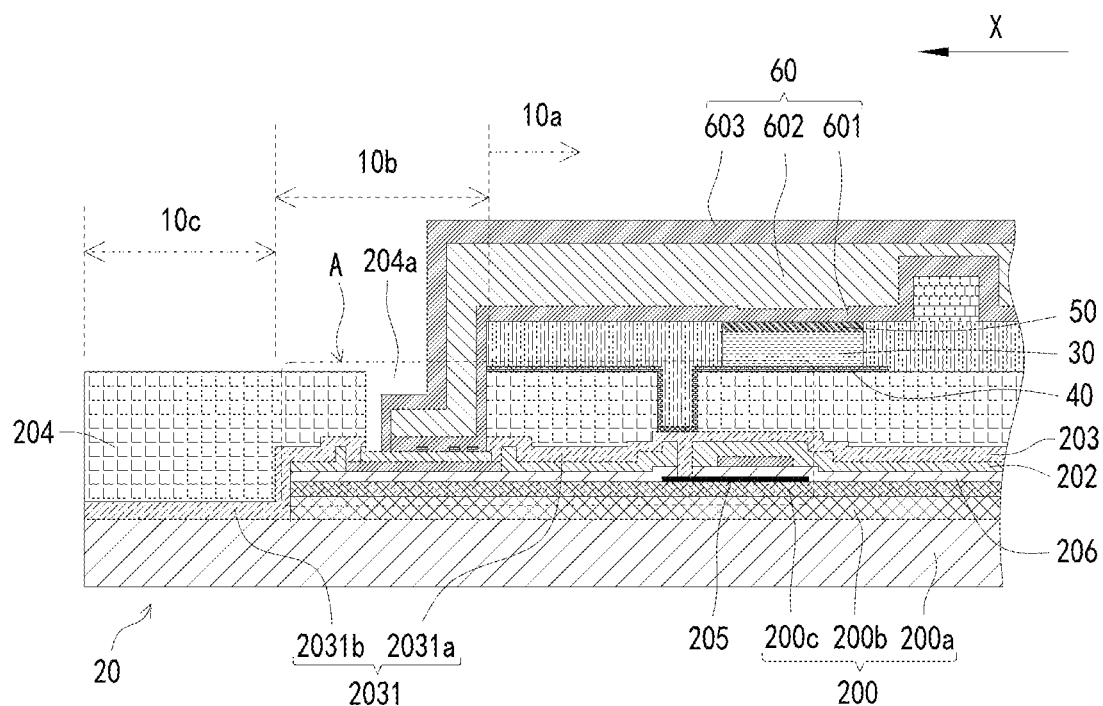
FIG. 2 is a partial cross-sectional structural schematic view of a display panel according to an embodiment of the present disclosure.
Figure 3:
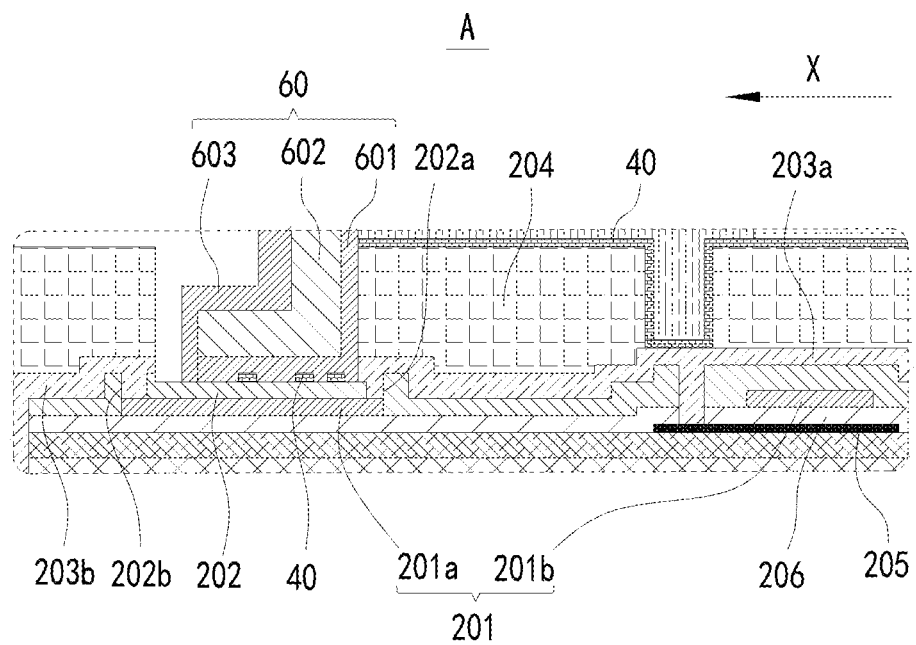
FIG. 3 is a partially enlarged view of A in FIG. 2.
Figure 4:
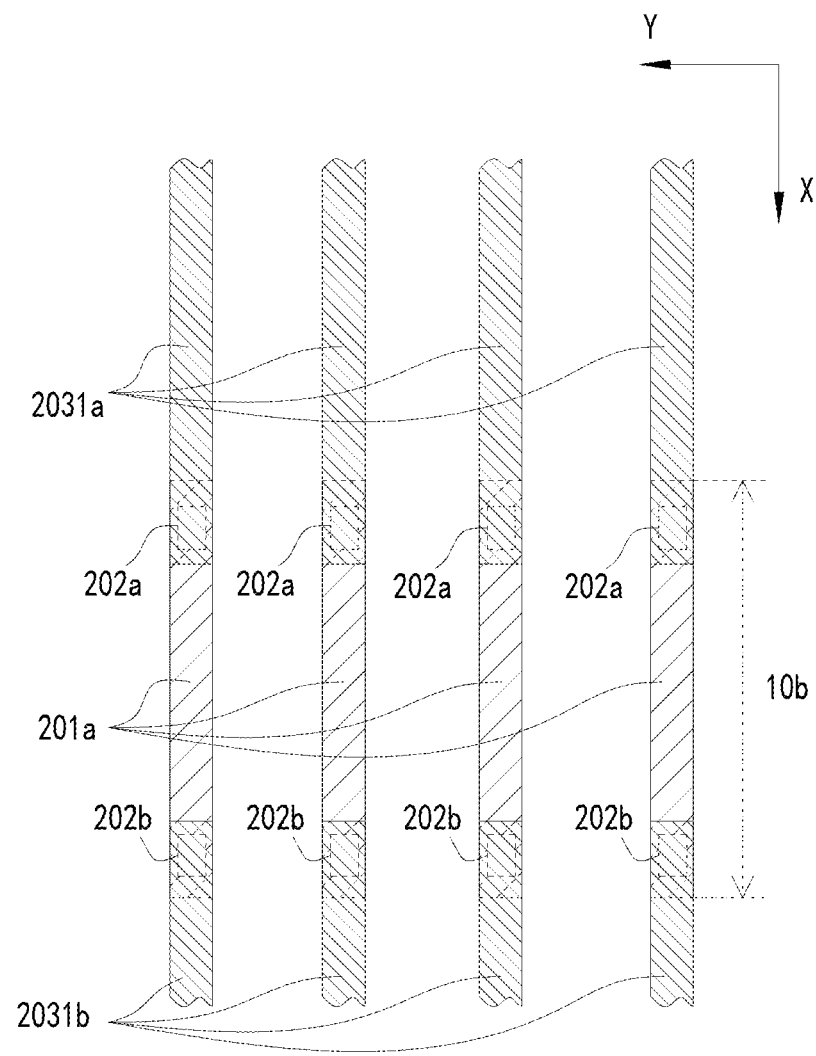
FIG. 4 is a partial top structural schematic view of a wire exchanging area according to an embodiment of the present disclosure.

Referring to FIG. 2 and FIG. 3, it is schematically shown that the display panel 10 according to the embodiment of the present disclosure includes an array substrate 20, a light emitting element 30, and a packaging body 60 for packaging the light emitting element 30. The array substrate 20 of this embodiment includes a flexible substrate 200, a first metal layer 201, an inorganic insulating layer 202, a second metal layer 203, and an organic flat layer 204 provided in a laminated manner. The flexible substrate 200 includes an organic base layer 200*a* and a barrier layer 200*b* and a buffer layer 200*c*. These layer structures are well known to those skilled in the art and will not be described again. An anode layer 40 and a cathode layer 50 are provided on opposite sides of the light emitting element 30 in this embodiment in the lamination direction. The anode layer 40 is electrically connected to the second metal layer 203. The packaging body 60 of this embodiment includes an inorganic layer 601, an organic layer 602, and an external inorganic layer 603. The inorganic layer 601, the organic layer 602, and the external inorganic layer 603 are provided in a laminated manner. Optionally, the packaging body 60 may include only one inorganic layer 601.

In this embodiment, the inorganic layer 601 and the inorganic insulating layer 202 are in direct contact with each other at the wire exchanging area 10*b* to form a packaging area. In this way, as the inorganic layer 601 and the inorganic insulating layer 202 are both formed of an inorganic material, a packaging area formed by the inorganic layer 601 contacting with the inorganic insulating layer 202 has a good sealing performance, and water vapor can be effectively prevented from entering the display area 10*a* through the sealing area.

In this embodiment, the non-display area 10*c* can be bent to the bottom of the display area 10*a* to form a shape of an arc. The wire exchanging area 10*b* extends along an axial direction of the arc. In one example, the display panel 10 as a whole has a rectangular structure having a predetermined length and width. The display area 10*a*, the wire exchanging area 10*b*, and the non-display area 10*c* of the display panel 10 are distributed in the length direction X.

In one embodiment, referring to FIG. 2 or FIG. 3, in the wire exchanging area 10*b*, the organic flat layer 204 is disconnected to form a slot 204*a* to expose the inorganic insulating layer 202. That is, the material of the organic flat layer 204 in the wire exchanging area 10*b* is removed and the inorganic insulating layer 202 is exposed. In the wire exchanging area 10*b*, the inorganic layer 601 extends into the slot 204*a* and contacts the surface of the inorganic insulating layer 202 to form a packaging area.

The slot 204*a* of this embodiment is provided as a through slot that is elongated and extends along the axial direction of the arc formed by the non-display area 10*c* being bent. In one example, the slot 204*a* on the organic flat layer 204 is provided as a through slot extending along the width direction Y of the display panel 10.

In this embodiment, a part of the first metal layer 201 is formed as a first signal wire 201*a*, and another part thereof is formed as a gate 201*b*. In one embodiment, the material of the first signal wire 201*a* in this embodiment is copper. The first signal wire 201*a* and the gate 201*b* are made of the same material. The first signal wire 201*a* is disposed under the inorganic insulating layer 202. The second metal layer 203 forms a plurality of second signal wires 2031. This is well known to those skilled in the art and will not be described again.

Continuing to refer to FIGS. 2 and 3, a first through holes 202*a* and a second through holes 202*b* are provided on the inorganic insulating layer 202 at intervals at a place of the display area 10*a* near the wire exchanging area 10*b* and at a place of the non-display area 10*c* near the wire exchanging area 10*b*. The second signal wire 2031 is disconnected in the wire exchanging area 10*b* to form a first segment 2031*a* in the display area 10*a* and a second segment 2031*b* in the non-display area 10*c*. The number of the second signal wires 2031 formed by the second metal layer 203 is plural. A portion of the first segment 2031*a* of the second signal wire 2031 extends to the first through hole to be electrically connected to the first signal wire 201*a*, and a portion of the second segment 2031*b* of the second signal wire 2031 extends to the second through hole to be electrically connected to the first signal wire 201*a*. Optionally, the first through hole 202*a* and the second through hole 202*b* are both straight holes.

In the wire exchanging area 10*b*, the array substrate 20 includes the anode layer 40 on the inorganic insulating layer 202, and the inorganic layer 601 is above the anode layer 40. The first segment 2031*a* and the second segment 2031*b* of the second signal wire 2031 are electrically connected by the first signal wire 201*a*. This can avoid a short circuit between the adjacent two second signal wires 2031 via the anode layer 40. The reason is that in the manufacturing process of the array, the anode material may remain in the area of the inorganic insulating layer 202 corresponding to the wire exchanging area 10b to form the anode layer 40, and the inorganic layer 601 covers the anode material.

In one embodiment, the array substrate 20 further includes a thin film transistor. The thin film transistor includes a semiconductor active layer 205 on the flexible substrate 200. The semiconductor active layer includes a source area and a drain area formed by doping an N-type impurity ion or a P-type impurity ion. The semiconductor active layer 205 can be formed by changing an amorphous silicon into polysilicon by crystallization of the amorphous silicon. The array substrate 20 further includes a gate insulating layer 206 on the flexible substrate 200. The source and drain are located on the gate insulating layer 206. The source and drain are electrically connected (or combined) to the source and drain areas via contact holes, respectively. The contact holes are formed by selectively removing the gate insulating layer 206 and the inorganic insulating layer 202.

The display panel 10 of an embodiment of the present disclosure includes the array substrate 20, the light emitting element 30, and the packaging body 60. The display panel 10 includes the display area 10a, the non-display area 10c located outside the display area 10a, and the wire exchanging area 10b provided between the display area 10a and the non-display area 10c. The packaging body 60 includes the inorganic layer 601. The inorganic layer 601 of the packaging body 60 is in contact with the inorganic insulating layer 202 included in the array substrate 20 at the wire exchanging area 10b to form a packaging area. Since the inorganic layer 601 and the inorganic insulating layer 202 are both formed of an inorganic material, a contact sealing effect thereof is good, and the reliability and stability of the packaging are improved. After the packaging body 60 and the array substrate 20 package the light emitting element 30 together, the packaging body 60 can effectively prevent water vapor from entering the display area 10a of the display panel 10, thereby improving the display quality of the display area 10a, and at the same time, dark spots or bubbles is not easy to appear in the display area 10a of the display panel 10.

An embodiment of the present disclosure further provides a display device including the display panel 10 of the foregoing embodiment. Since the display panel 10 of this embodiment has a stable and reliable packaging state, it is difficult for dark spots or bubbles to appear in the display area 10a of the display panel 10, so that the display device of this embodiment has good display quality and durability.

Although the present disclosure has been described with reference to preferred embodiments, various modifications can be made thereto and the components therein can be replaced with equivalents without departing from the scope of the present disclosure, especially as long as there is no structural conflict, the technical features mentioned in the embodiments can be combined in any way. The present disclosure is not limited to the specific embodiments disclosed herein, but includes all technical solutions falling within the scope of the claims.

What is claimed is:

1. A display panel, comprising: a display area, a non-display area located outside the display area, and a wire exchanging area provided between the display area and the non-display area, and the display panel further comprising an array substrate comprising a flexible substrate, a first metal layer, an inorganic insulating layer, a second metal layer, and an organic flat layer provided in a laminated manner; a light-emitting element; and a packaging body configured for packaging the light-emitting element and comprising an inorganic layer directly contacting with the inorganic insulating layer in the wire exchanging area,
wherein the first metal layer forms a first signal wire under the inorganic insulating layer, the second metal layer forms a second signal wire, the second signal wire is disconnected in the wire exchanging area to form a first segment in the display area and a second segment in the non-display area, and the first segment and the second segment are electrically connected via the first signal wire.

2. The display panel according to claim 1, wherein the inorganic insulating layer comprises a first through hole and a second through hole spaced apart, a portion of the first segment extends to the first through hole and is electrically connected to the first signal wire, and a portion of the second segment extends to the second through hole and is electrically connected to the first signal wire.

3. The display panel according to claim 2, wherein the first through hole and the second through hole are both straight holes.

4. The display panel according to claim 3, wherein the array substrate comprises an anode material on the inorganic insulating layer in the wire exchanging area, and the inorganic layer covers the anode material.

5. The display panel according to claim 2, wherein the array substrate comprises an anode material on the inorganic insulating layer in the wire exchanging area, and the inorganic layer covers the anode material.

6. The display panel according to claim 1, wherein the non-display area can be bent to a bottom of the display area so as to form a shape of an arc, and the wire exchanging area extends along an axial direction of the arc.

7. The display panel according to claim 1, wherein the organic flat layer is disconnected to form a slot in the wire exchanging area so as to expose the inorganic insulating layer, and the inorganic layer extends into the slot and directly connects with the inorganic insulating layer.

8. The display panel according to claim 7, wherein the slot is provided as a through slot extending along the axial direction of the arc.

9. The display panel according to claim 1, wherein the packaging body further comprises an organic layer provided on the inorganic layer and an external inorganic layer provided on the organic layer.

10. A display device comprising the display panel according to claim 1.

11. The display panel according to claim 1, wherein the array substrate comprises an anode material on the inorganic insulating layer in the wire exchanging area, and the inorganic layer covers the anode material.

12. A display panel, comprising: a display area, a non-display area located outside the display area, and a wire exchanging area provided between the display area and the non-display area, and the display panel further comprising an array substrate comprising a flexible substrate, a first metal layer, an inorganic insulating layer, a second metal layer, and an organic flat layer provided in a laminated manner; a light-emitting element; and a packaging body configured for packaging the light-emitting element and comprising an inorganic layer directly contacting with the inorganic insulating layer in the wire exchanging area;
wherein the array substrate comprises an anode material on the inorganic insulating layer in the wire exchanging area, and the inorganic layer covers the anode material.

13. The display panel according to claim 12, wherein the first metal layer forms a first signal wire under the inorganic insulating layer, the second metal layer forms a second signal wire, the second signal wire is disconnected in the wire exchanging area to form a first segment in the display area and a second segment in the non-display area, and the first segment and the second segment are electrically connected via the first signal wire.

14. The display panel according to claim 13, wherein the inorganic insulating layer comprises a first through hole and a second through hole spaced apart, a portion of the first segment extends to the first through hole and is electrically connected to the first signal wire, and a portion of the second segment extends to the second through hole and is electrically connected to the first signal wire.

15. The display panel according to claim 14, wherein the first through hole and the second through hole are both straight holes.

16. The display panel according to claim 12, wherein the non-display area can be bent to a bottom of the display area so as to form a shape of an arc, and the wire exchanging area extends along an axial direction of the arc.

17. The display panel according to claim 12, wherein the organic flat layer is disconnected to form a slot in the wire exchanging area so as to expose the inorganic insulating layer, and the inorganic layer extends into the slot and directly connects with the inorganic insulating layer.

18. The display panel according to claim 17, wherein the slot is provided as a through slot extending along the axial direction of the arc.

19. The display panel according to claim 12, wherein the packaging body further comprises an organic layer provided on the inorganic layer and an external inorganic layer provided on the organic layer.

* * * * *